(12) United States Patent
O'Connell et al.

(10) Patent No.: US 8,179,204 B2
(45) Date of Patent: May 15, 2012

(54) BANDGAP IMPEDANCE SURFACE OF POLAR CONFIGURATION USABLE IN A WAVEGUIDE TRANSITION MODULE

(75) Inventors: John B. O'Connell, Seattle, WA (US); Bruce L. Blaser, Auburn, WA (US)

(73) Assignee: The Boeing Company, Chicago, IL (US)

( * ) Notice: Subject to any disclaimer, the term of this patent is extended or adjusted under 35 U.S.C. 154(b) by 206 days.

(21) Appl. No.: 12/228,380

(22) Filed: Aug. 11, 2008

(65) Prior Publication Data

US 2010/0033272 A1 Feb. 11, 2010

(51) Int. Cl.
*H01P 5/103* (2006.01)

(52) U.S. Cl. .......................................... 333/26; 333/248
(58) Field of Classification Search ............... 333/26, 333/248
See application file for complete search history.

(56) References Cited

U.S. PATENT DOCUMENTS

| | | | |
|---|---|---|---|
| 2,962,677 A * | 11/1960 | Edwards | ......................... 333/27 |
| 5,886,671 A | 3/1999 | Riemer et al. | |
| 6,512,494 B1 | 1/2003 | Diaz et al. | |
| 6,670,930 B2 | 12/2003 | Navarro | |
| 7,268,650 B2 * | 9/2007 | Higgins | ......................... 333/248 |
| 7,612,632 B2 * | 11/2009 | Tanaka et al. | ..................... 333/26 |
| 2007/0188258 A1 * | 8/2007 | Ohno et al. | ....................... 333/26 |

OTHER PUBLICATIONS

Daniel Frederic Sievenpiper, "High-Impedance Electromagnetic Surfaces", PhD dissertation, UCLA, 1999, 162 pages.
Douglas J. Kern et al., "The Design Synthesis of Multiband Artificial Magnetic Conductors Using High Impedance Frequency Selective Surfaces", IEEE Transactions on Antennas and Propagation, vol. 53, No. 1, Jan. 2005, pp. 8-17.
Romulo F. Jimenez Broas, et al., "An Application of High-Impedance Ground Planes to Phased Array Antennas", IEEE Transactions on Antennas and Propagation, vol. 43, No. 4, Apr. 2005, pp. 1377-1381.

* cited by examiner

*Primary Examiner* — Benny Lee
(74) *Attorney, Agent, or Firm* — Harness, Dickey & Pierce, P.L.C.

(57) ABSTRACT

A bandgap surface for use in a waveguide transition module. The surface may be constructed with a ground plane; a capacitive layer including a plurality of capacitive elements arranged in a polar configuration within a common plane, and spaced apart from said ground plane; and a plurality of electrically conductive vias formed within a dielectric layer of material that conductively couple said ground plane to each of said capacitive elements.

19 Claims, 13 Drawing Sheets

BANDGAP IMPEDANCE SURFACE OF POLAR CONFIGURATION USABLE IN A WAVEGUIDE TRANSITION MODULE

FIELD

The present disclosure relates to impedance surfaces, and more particularly to more compactly constructed impedance surfaces and waveguide transition modules making use of such impedance surfaces.

BACKGROUND

The statements in this section merely provide background information related to the present disclosure and may not constitute prior art.

Current coaxial to waveguide transition modules require a quarter wavelength back short between the conductive elements and a ground plane. For example, for operations at 15 GHz using a construction material with a relative dielectric of 2.2 and a circular waveguide diameter of 0.340 inch, the quarter wavelength is approximately 0.350 inch thick. Put differently, the quarter wavelength back short will have a height of about 0.350 inch. When this transition module is fabricated into a printed wiring board that also contains clock, data, voltage, ground planes and multiple stripline layers (as required for multiple polarizations or frequencies), the final stackup height of the overall assembly can easily exceed about 0.450 inch in height. Such a height is undesirable for a number of applications, and particularly phased array antenna applications, where the compactness of the module is of the utmost importance.

Existing solutions typically require construction of two separate wiring boards, one containing the quarter wavelength back short and one containing the additional circuits. The separate wiring boards are then joined using an epoxy bond process. As will be appreciated, the requirement of having to join the two assemblies with epoxy adds to the manufacturing complexity and cost of producing a waveguide transition module. The resulting module may also be undesirably thick.

SUMMARY OF THE INVENTION

In one aspect the present disclosure relates to a bandgap surface for use in a transition module. The surface may comprise: a ground plane; a capacitive layer including a plurality of capacitive elements arranged in a polar configuration within a common plane, and spaced apart from the ground plane; and a plurality of electrically conductive vias formed within a dielectric layer of material that conductively couple the ground plane to each of the capacitive elements.

In another aspect the present disclosure relates to a dual frequency impedance surface for use in a transition module. The impedance surface may comprise: a first impedance surface forming a plane, and adapted to resonate at a first frequency; and a second impedance surface placed within a void in the first impedance surface so as to be disposed within the plane and circumscribed by the first impedance surface, the second impedance surface being adapted to resonate at a second frequency different than the first frequency.

In another aspect the present disclosure relates to a waveguide for transitioning between transverse electromagnetic (TEM) wave and transverse electric (TE) wave modes. The waveguide may comprise: a tubular waveguide structure for conducting a TE wave; a polar geometry impedance surface disposed within the tubular waveguide structure generally normal to a longitudinal axis of the tubular waveguide structure; a pair of coaxial transmission line sections extending orthogonal to the polar geometry impedance surface, and terminating adjacent to the polar geometry surface, for conducting a TEM mode wave; and first and second conductive elements arranged generally at a right angle to one another, and positioned over the polar geometry impedance surface adjacent the coaxial transmission line segments, for interfacing signals passing between the coaxial transmission line sections and the polar geometry surface such that the signals transition between the TEM and TE wave modes.

In still another aspect the present disclosure relates to a waveguide for transitioning between two transverse electromagnetic (TEM) wave modes and two transverse electric (TE) wave modes. The waveguide may comprise: a tubular waveguide structure for conducting a TE wave; a polar geometry impedance surface for resonating at a first frequency, and being disposed within said tubular waveguide structure generally normal to a longitudinal axis of the tubular waveguide structure; a first pair of coaxial transmission line sections terminating adjacent the polar geometry impedance surface, for conducting a first TEM mode wave between the first pair of coaxial transmission line sections and the polar geometry impedance surface; and first and second conductive elements arranged generally at a right angle to one another, and positioned over the polar geometry impedance surface and coupled to the first pair of coaxial transmission line segments, for interfacing signals passing between the first pair of coaxial transmission line sections and the polar geometry impedance surface such that the signals transition between the TEM and TE wave modes; a second impedance surface for resonating at a second frequency, and being disposed adjacent the polar geometry impedance surface; and third and fourth conductive elements arranged generally at right angles to one another, and arranged over the second impedance surface adjacent connected to conductive traces, for interfacing signals passing between the second impedance surface and the ground plane such that the signals transition between the TEM and TE wave modes.

In still another aspect the present disclosure relates to a method for forming a bandgap surface as a multilayer board assembly. The method may comprise: forming a ground plane as a first layer; forming a capacitive layer as a second layer using a plurality of capacitive elements arranged in a polar configuration within a common plane; disposing the second layer adjacent the first layer; and forming the first layer to include a plurality of electrically conductive vias that electrically couple the ground plane to each of the capacitive elements.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The drawings described herein are for illustration purposes only and are not intended to limit the scope of the present disclosure in any way.

DETAILED DESCRIPTION OF THE INVENTION

The following description is merely exemplary in nature and is not intended to limit the present disclosure, application, or uses. It will also be appreciated that like numbers used in the written specification correspond to similar components in the drawings. Thus component 100, for example, if shown in FIG. 7, relates to the same component shown and discussed in FIG. 3, even though no additional explicit description of component 100 may be provided in the written discussion of FIG. 7.

Figure 1:
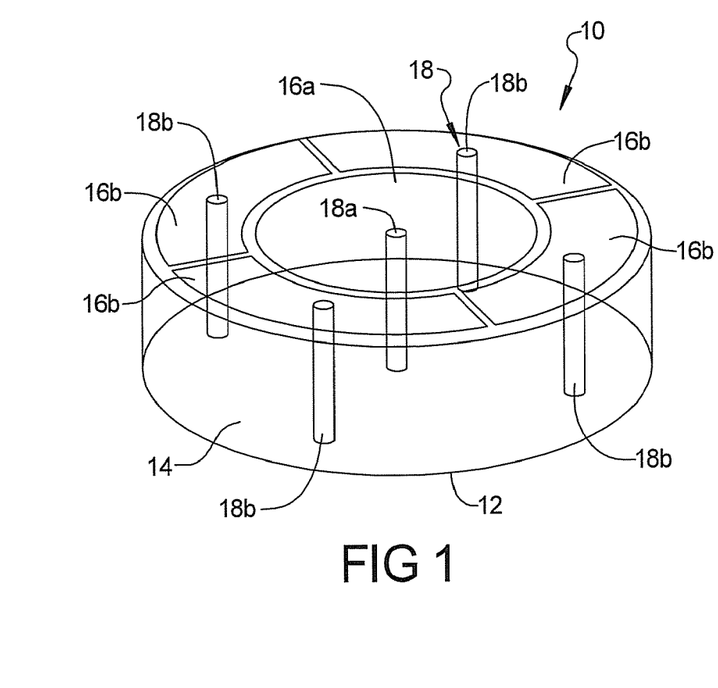
FIG. 1 is a perspective view of an assembly forming a bandgap surface in accordance with one embodiment of the present disclosure.
Figure 2:
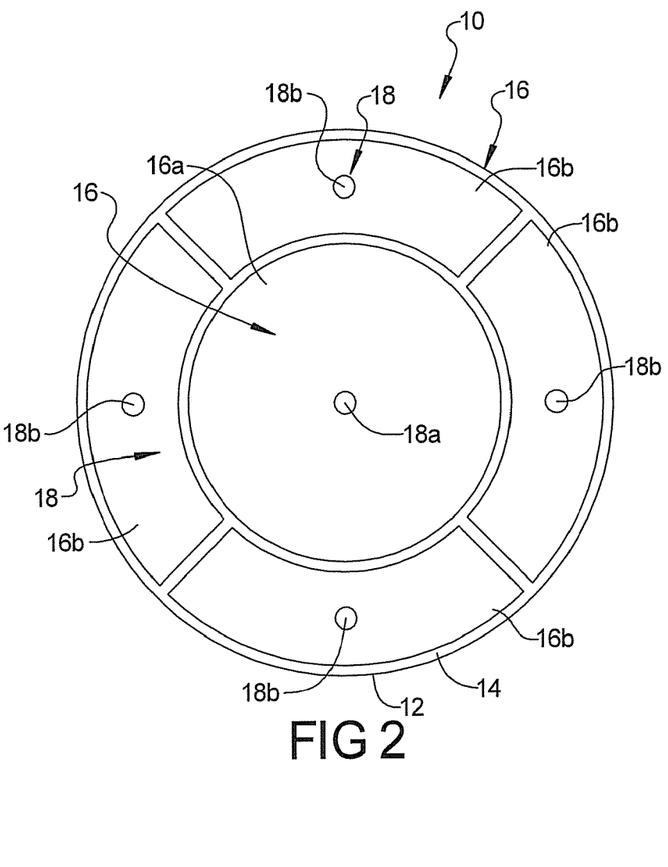
FIG. 2 is a plan view of the assembly of FIG. 1.

Referring to FIGS. 1 and 2, there is shown one embodiment of an assembly 10 or "stackup" that forms a polar geometry bandgap surface. The assembly 10 makes use of a ground plane 12 formed on one surface of a dielectric layer 14, a plurality of capacitive elements or plates 16a and 16b (referred to collectively as "capacitive elements or plates 16") arranged on an opposite surface of the dielectric layer 14, and a plurality of electrically conductive or inductive vias 18a and 18b (collectively referred to as "conductive vias 18") formed within the dielectric layer 14 to electrically couple the ground plane 12 to each of the capacitive elements 16a and 16b. The dielectric layer 14 may comprise Duroid 5880 or any other suitable dielectric and typically will be in the range of about 20-30 mils (0.508-0.762 mm) thick. The electrical vias 18 will typically have a diameter of about 0.005 inch (0.127 mm) and be manufactured from copper, gold or another suitable conductor. The vias 18 are arranged to extend orthogonal to the capacitive elements 16.

The assembly 10 has the capacitive plates 16 arranged in a polar configuration with the central circular element 16a surrounded by the arcuately shaped capacitive elements 16b. This is in contrast to previously developed bandgap surfaces that rely on an X-Y grid of capacitive elements. The assembly 10 forms an electromagnetic bandgap ("EBG") surface that does not support an electric current and reflects a tangential electric ("E") field with a phase shift of zero degrees (i.e., an open circuit). In contrast, a normal ground plane does support an electric current and reflects a tangential E field with a phase shift of 180 degrees. Any induced current on a conductive element placed adjacent to a normal ground will be cancelled due to the 180 degree phase shift while the induced current on a conductive element placed adjacent to an EBG surface will not. In previously developed systems using a normal ground plane, the conductive elements will be found a quarter wavelength above the ground plane where the total field path length will measure 1 wavelength. It can be appreciated, then, that an EBG ground surface will allow significantly more compact construction when paired with conductive elements.

Figure 3:
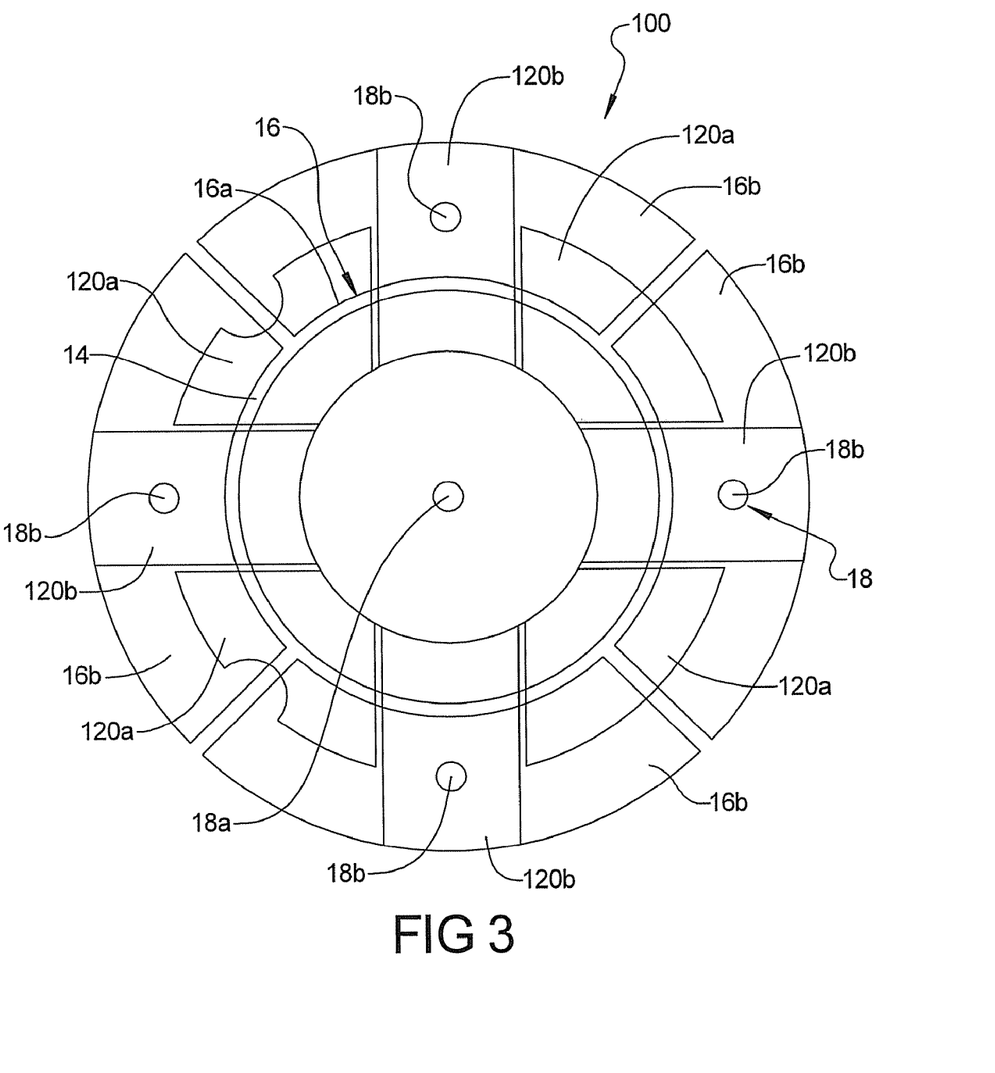
FIG. 3 is a plan view of another embodiment of the present disclosure that makes use of an additional layer of capacitive elements.
Figure 4:
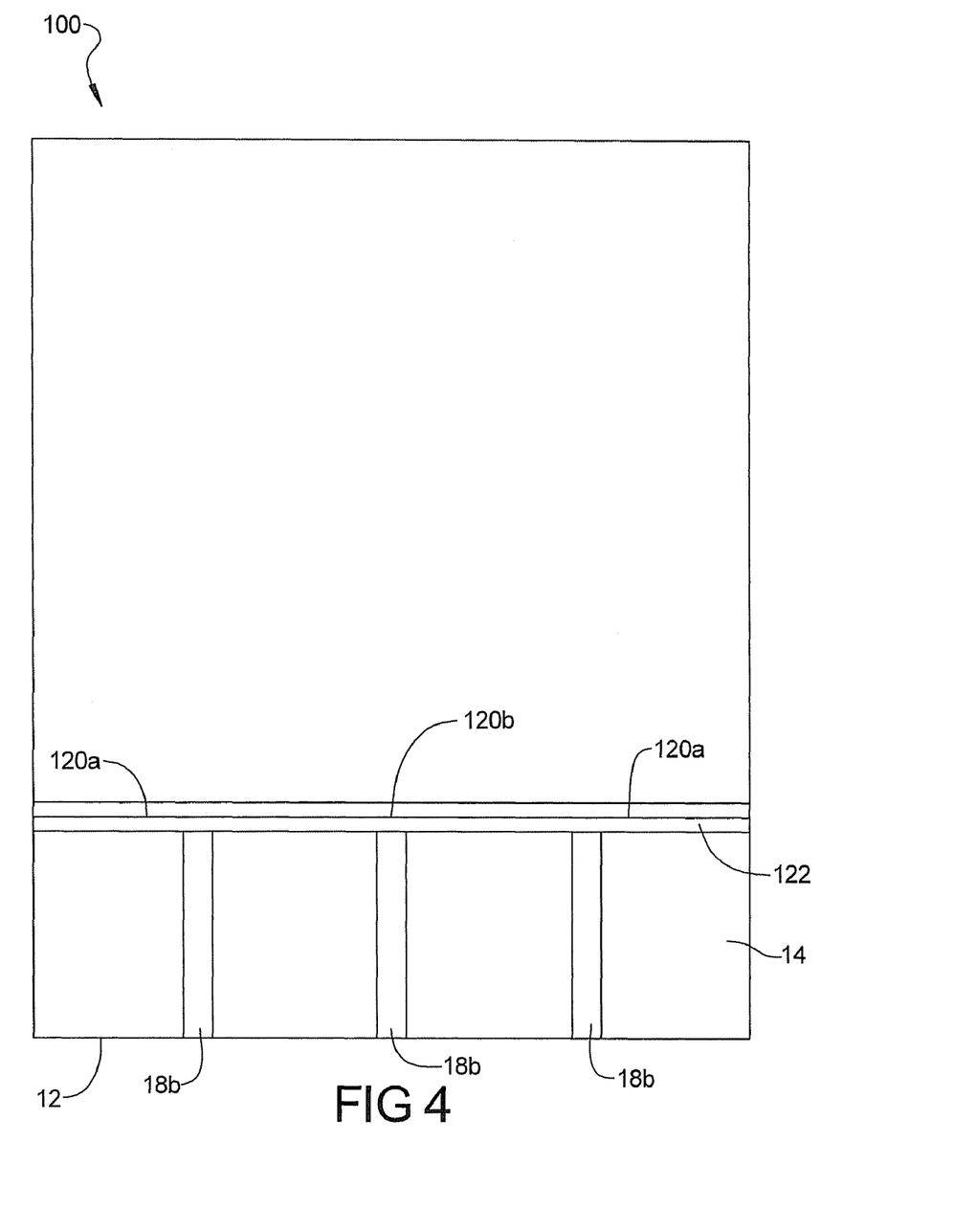
FIG. 4 is a side view of the assembly of FIG. 3.

Referring to FIGS. 3 and 4, another assembly 100 (FIG. 3) is shown in accordance with another embodiment of the present disclosure. This embodiment makes use of the capacitive plates 16a and 16b, as well as conductive vias 18a and 18b. The assembly 100 is identical in construction to the assembly 10 but also includes a second layer (i.e., second plane) of capacitive elements 120a and 120b (referred to collectively as "capacitive elements 120") formed on a dielectric layer 122 (FIG. 4), and arranged in a polar configuration. The dielectric layer 122 is positioned on the dielectric layer 14. The second layer of capacitive elements 120 operates to lower the tuned frequency of the assembly 100. This is because the resonant frequency is determined by 1/sLC.

Figure 5:
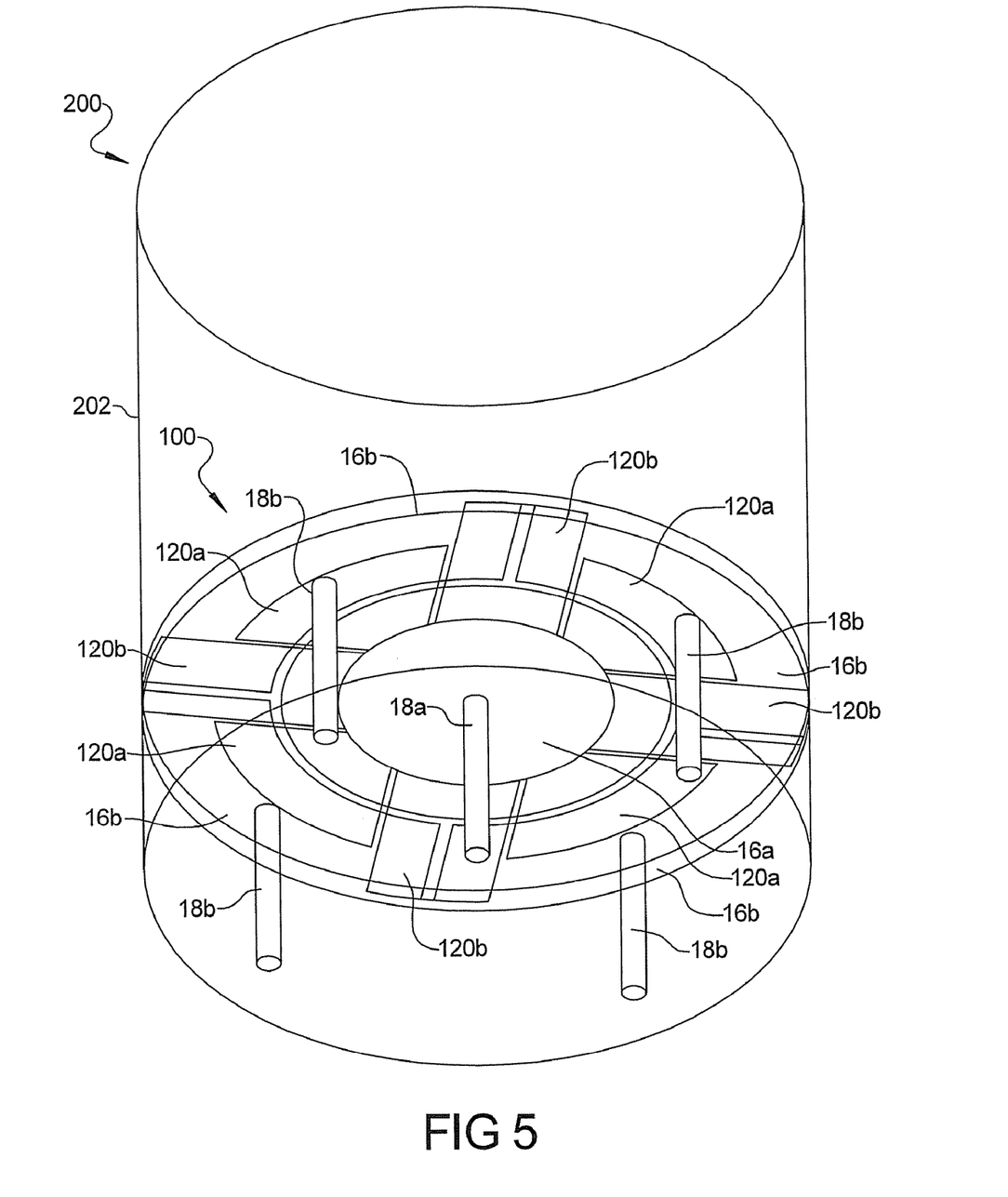
FIG. 5 is a perspective view of the assembly of FIG. 3 incorporated into a circular waveguide.

Referring to FIG. 5 an apparatus 200 is shown that includes the apparatus 100 disposed within a circular waveguide structure 202. The waveguide structure 202 will typically be filled with a suitable dielectric material, such as RO3006, with the axial center of the apparatus 200 disposed in alignment with the axial center of the waveguide structure 202. The apparatus 200 also includes components 16a, 16b, 18b, 120a and 120b in the manner described in connection with FIGS. 1-4.

Figure 6:
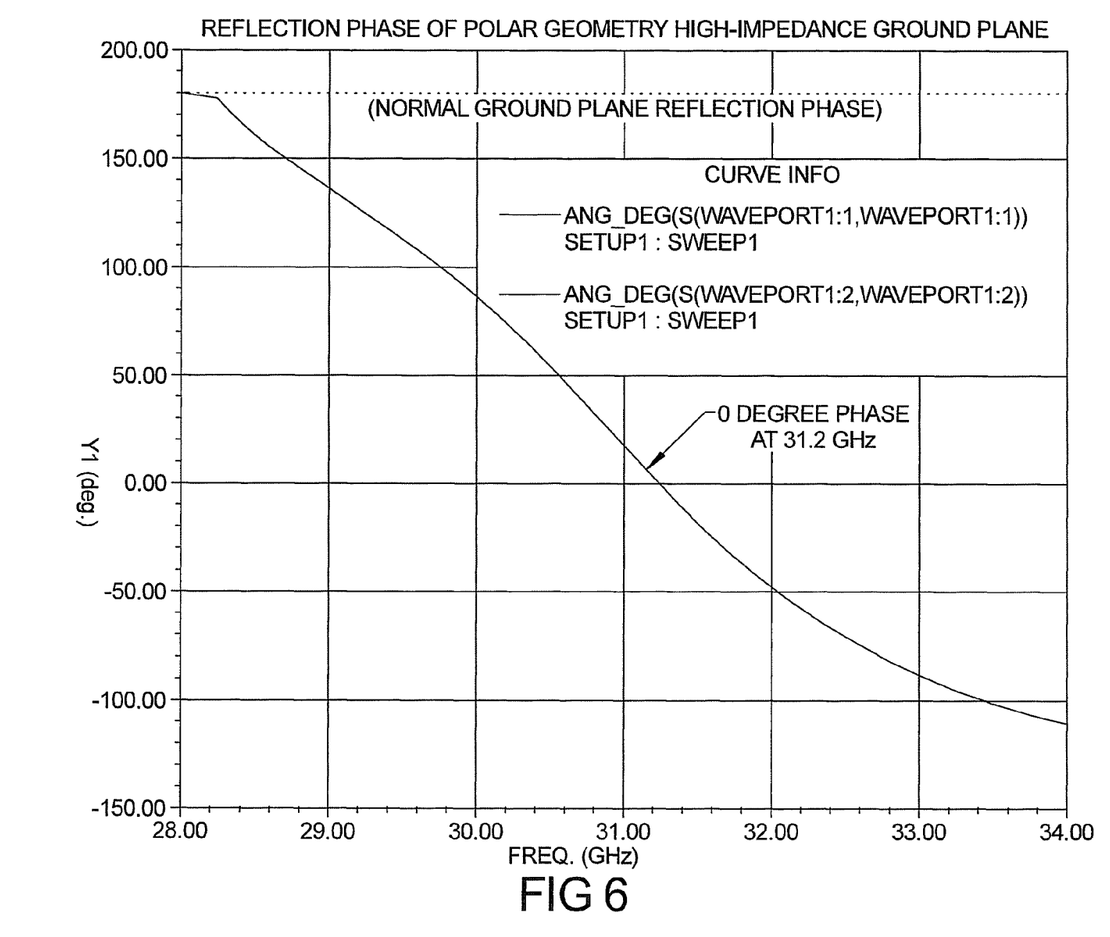
FIG. 6 is a graph illustrating the reflection phase of a polar geometry, high impedance ground plane, and more particularly the reflection performance (in degrees) of the waveguide of FIG. 5 at various frequencies between 28 GHz and 34 GHz, relative to a normal ground plane reflection phase.

FIG. 6 illustrates the reflection phase performance of the apparatus 100 of FIG. 1, with the graph of FIGS. 6 showing reflection Y1 in degrees, relative to the frequency in GHz. In this example the apparatus 100 is tuned for a resonant frequency of 31 GHz. It will be noted that the reflection Y1 at the EBG surface (i.e., components 16a and 16b) of the apparatus 100 (in degrees) is approximately zero degrees at 31 GHz. Thus, the apparatus 100 forms a highly effective reflective band gap surface. The apparatus 100, whose performance is illustrated in FIG. 6, includes components 14, 16a, 16b, 18a, 18b, 120, 120a, 120b and 122 as discussed in connection with FIGS. 1-4.

Figure 7:
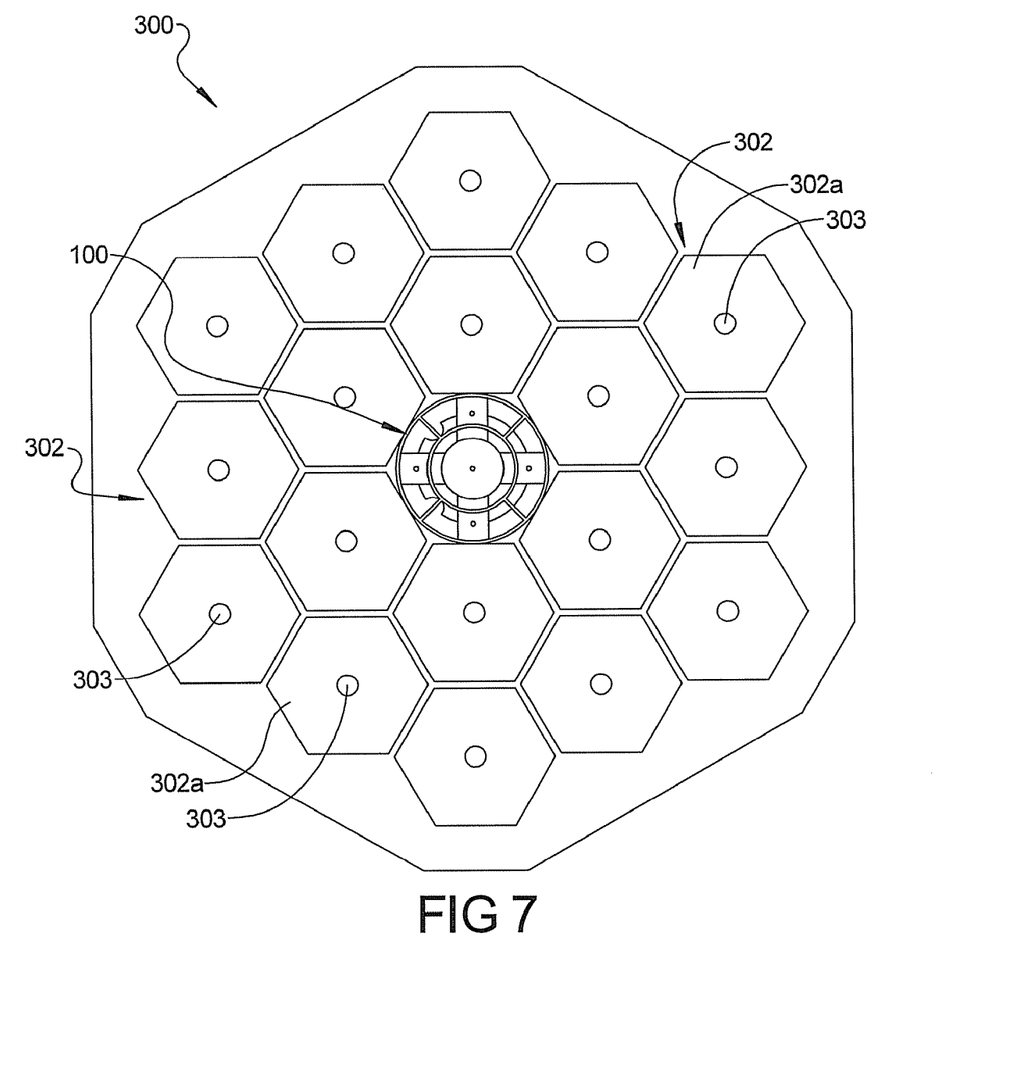
FIG. 7 is a plan view of another embodiment of the present disclosure that forms a first waveguide within a second waveguide.

Referring to FIG. 7 an apparatus 300 in accordance with another embodiment of the present disclosure is illustrated. The apparatus 300 effectively combines two bandgap surfaces that may be tuned to different frequencies. This is accomplished by incorporating the apparatus 100 within a well known Sievenpiper bandgap surface 302, although a second bandgap surface of a polar configuration may also be used. The apparatus 100 is preferably arranged at the axial center of the Sievenpiper bandgap surface 302. The Sievenpiper bandgap surface 302 as shown makes use of a plurality of capacitive elements 302a arranged in an hexagonal pattern. Other popular embodiments of the Sivenpiper bandgap surface 302 make use of rectangular capacitive elements arranged in an X-Y grid. Each capacitive element is coupled to its own electrically conductive via 303. The apparatus 100 in this example forms a high impedance ground plane for high band operation, while the Sievenpiper bandgap surface 302 forms a high impedance ground plane for low band operation. The precise frequency band for the apparatus 100 and the Sievenpiper bandgap surface 302 is selected in accordance with the needs of a particular application. For example, the apparatus 100 may be tuned to a resonant frequency of 31 GHz while the Sievenpiper bandgap surface may be tuned to a lower frequency of 14.5 GHz.

Figure 8:
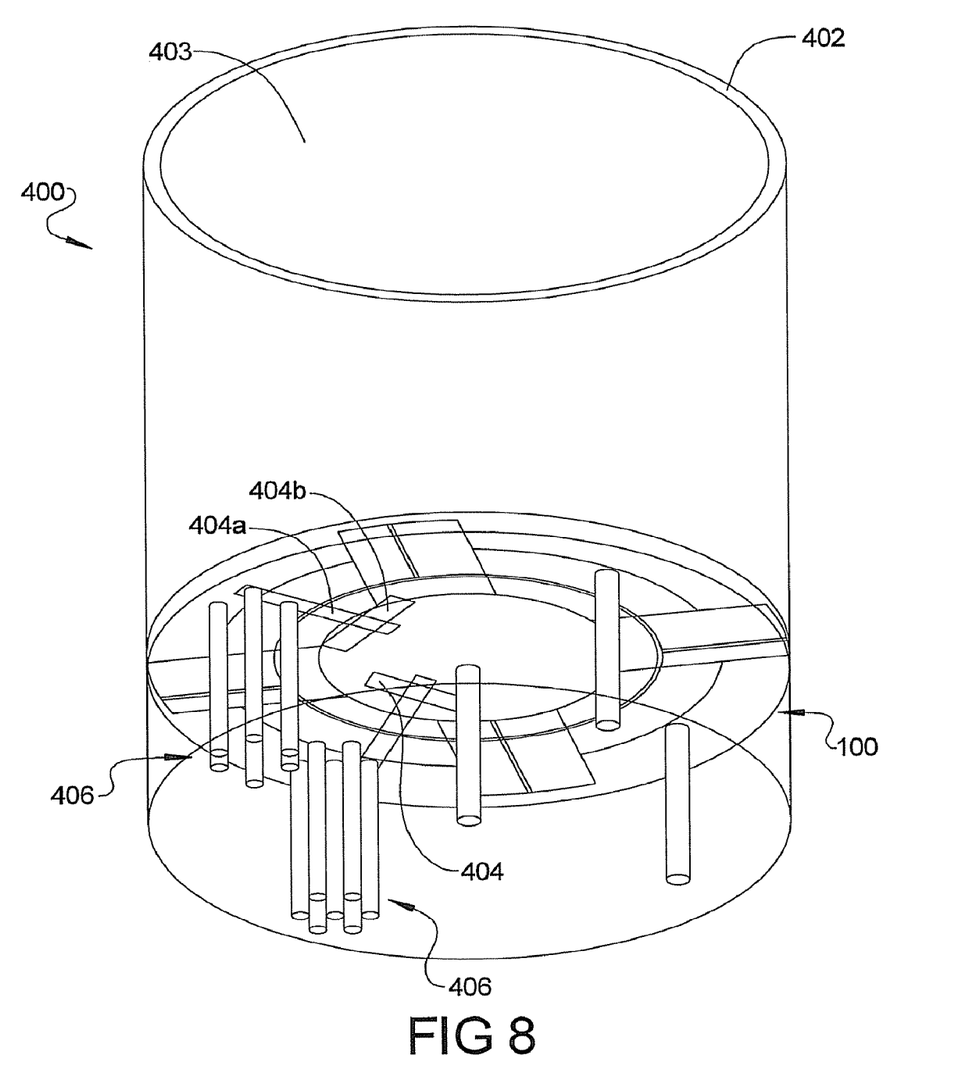
FIG. 8 is a perspective view of a waveguide transition module incorporating the assembly of FIG. 3 for transitioning a TEM wave mode to a TE wave mode, and vice versa.

Referring to FIG. 8, a waveguide transition module 400 is shown in accordance with another embodiment of the present disclosure. The module 400 includes the apparatus 100 positioned within a circular waveguide structure 402 filled with a dielectric material forming a plug 403. Conductive elements 404, (each having a first element 404a and a second element 404b) disposed on an additional layer of dielectric material that resides on the apparatus 100, and the conductive elements 404a and 404b are arranged orthogonal to one another. The orthogonal elements 404a and 404b used in this embodiment allow the generation of waveguide field vectors in linear or circular polarizations. It will be understood that a single conductive element may be used in place of the dual orthogonal elements 404a, 404b if only a linearly polarized field vector is required. A pair of coaxial transmission lines 406 replaces the pair of conductive vias 18b. The coaxial transmission lines 406 are also aligned with the conductive elements 404a, 404b and terminate such that the center conductor of each coaxial transmission line 406 contacts a respective one of the conductive elements 404a, 404b. Thus, it will be appreciated that the apparatus 100 is modified to accommodate the formation of the coaxial transmission lines 406 so that the lines extend through the dielectric material 14 of the apparatus 100. The waveguide transition module 400 operates to transition a coaxial mode (TEM) signal to a waveguide mode (TE) signal, or vice versa, depending on the direction of flow of the signal passing through the module.

Figure 9:
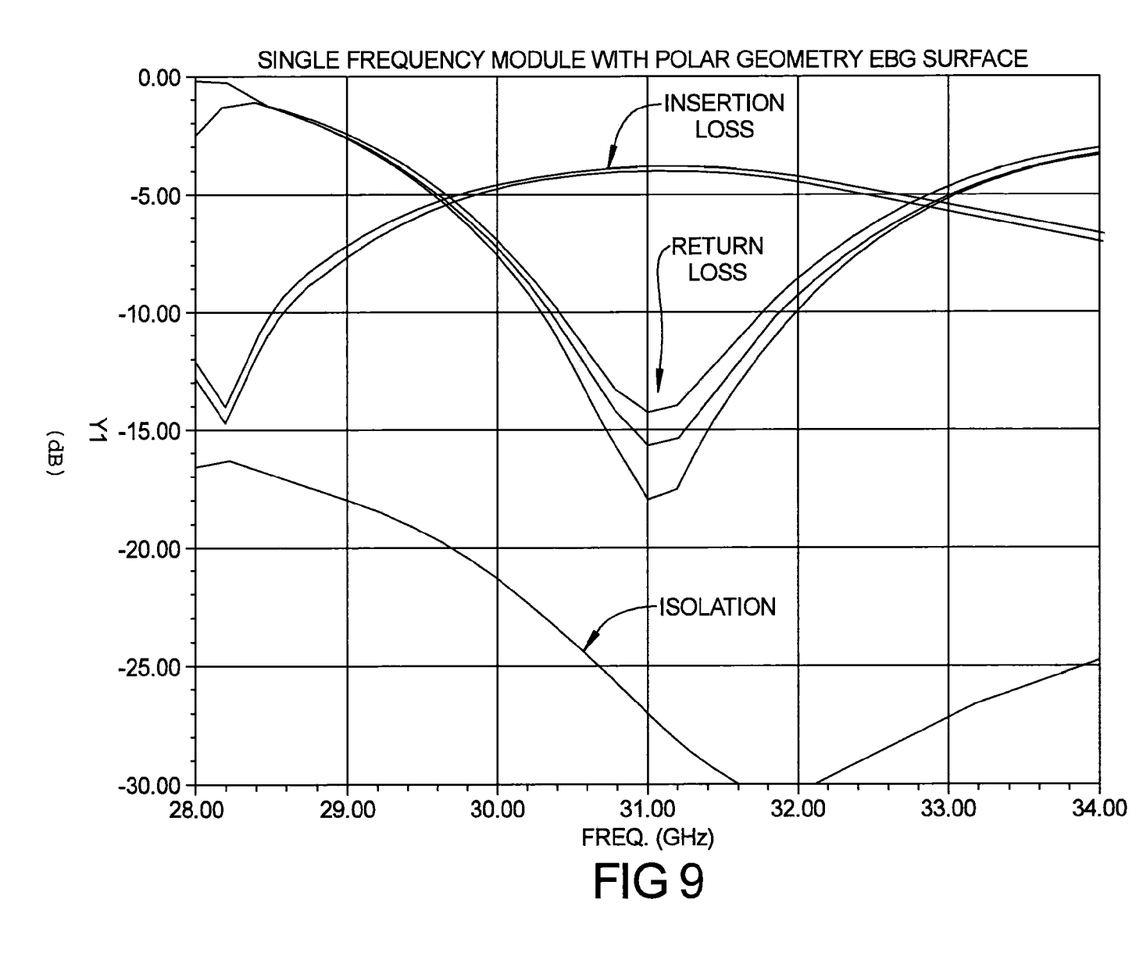
FIG. 9 is a graph entitled "Single Frequency Module with Polar Geometry EBG Surface", which illustrates the insertion loss, the return loss and isolation of signals (all represented by "Y1" in dBs relative to frequency, in GHz) passing through the assembly of FIG. 8.

FIG. 9 shows a graph that illustrates the insertion loss, return loss and isolation of the waveguide transition module 400 of FIG. 8, with the losses Y1 (in dBs) plotted relative to frequency, in GHz. The insertion loss is ideally as low as possible while the return loss is ideally as high as possible. The isolation is ideally maximized at the resonant frequency. In this example, with the module 400 tuned for a resonant frequency of 32 GHz, the input signal is split evenly between different ones of the conductive element pairs 404a/404b. The insertion loss between the conductive elements is virtually identical and is minimized at about 1 dB at the resonant frequency. The insertion loss shown in FIG. 9 of 4 dB includes the 3 dB from the signal split. Conversely, the return loss of the conductive element pairs 404a/404b is ideally maximized at the resonant frequency. FIG. 9 illustrates the return loss experienced by the conductive element pairs 404a/404b as being similar and maximized at the resonant frequency. The isolation of the conductive element pairs 404a/404b is also maximized at the resonant frequency.

Figure 10:
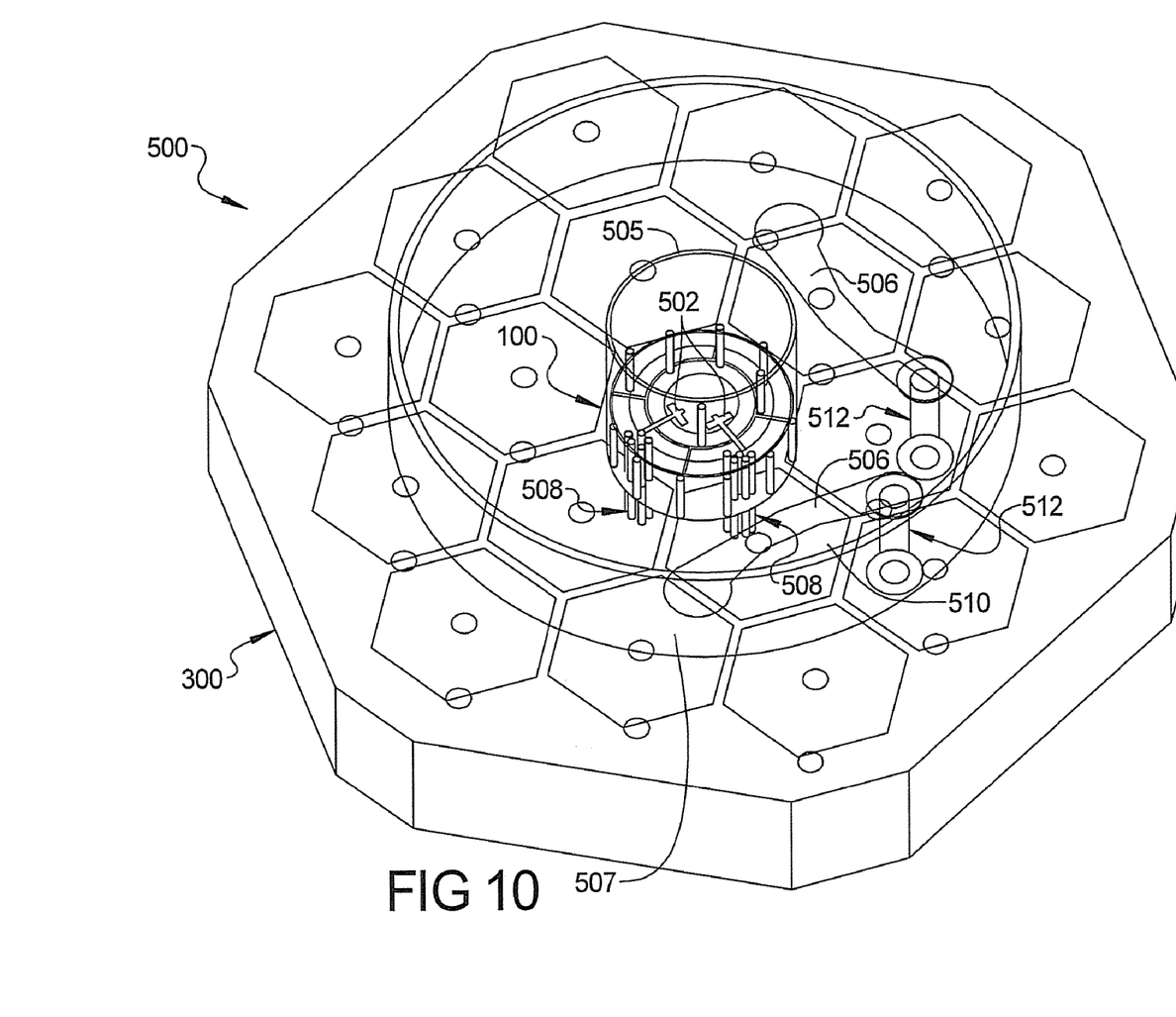
FIG. 10 is a perspective illustration of a waveguide transition module that transitions two coaxial (TEM) modes to two waveguide (TE) modes, and vice versa.
Figure 11:
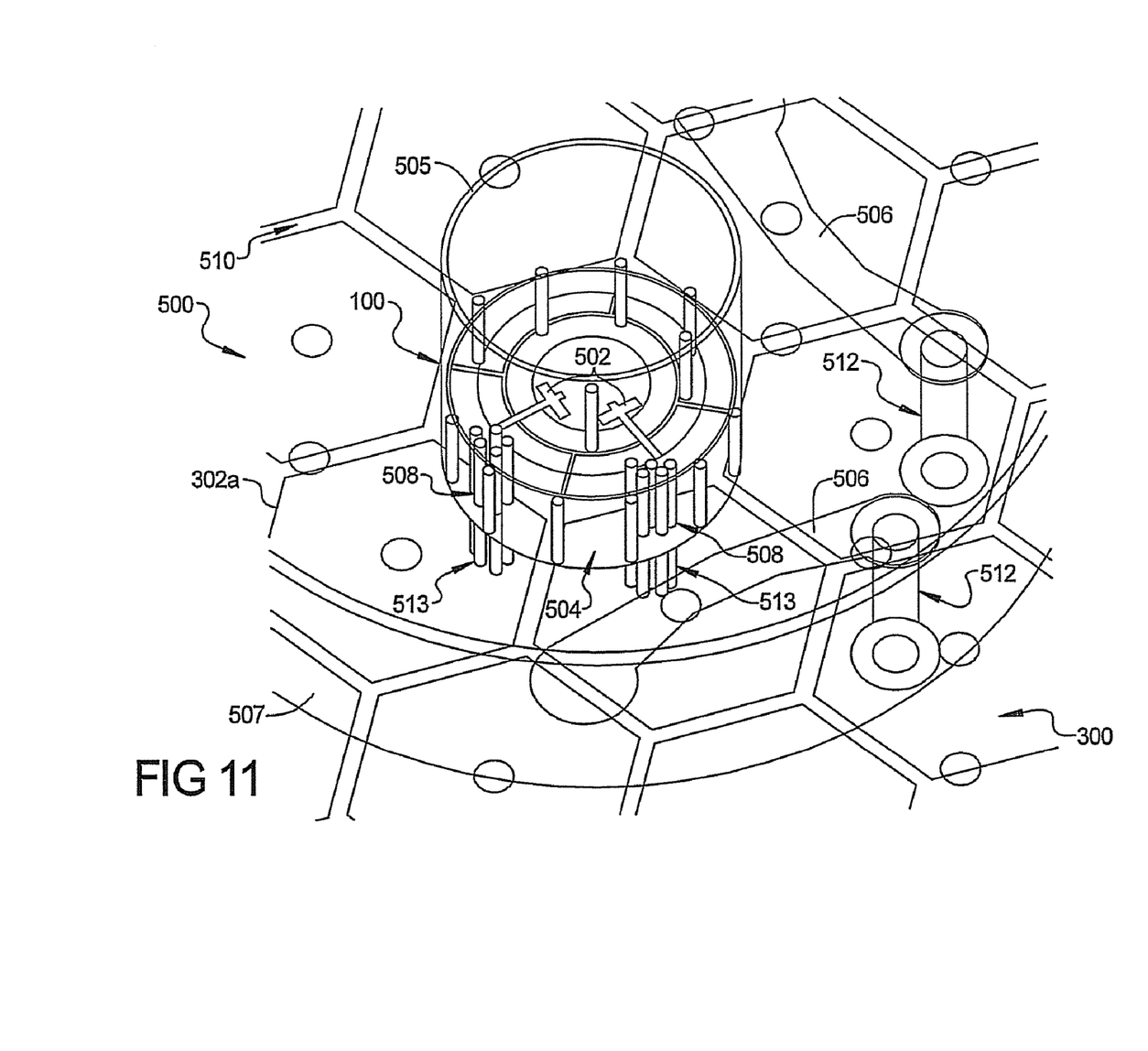
FIG. 11 is an enlarged view of a center portion of the module of FIG. 10.
Figure 12:
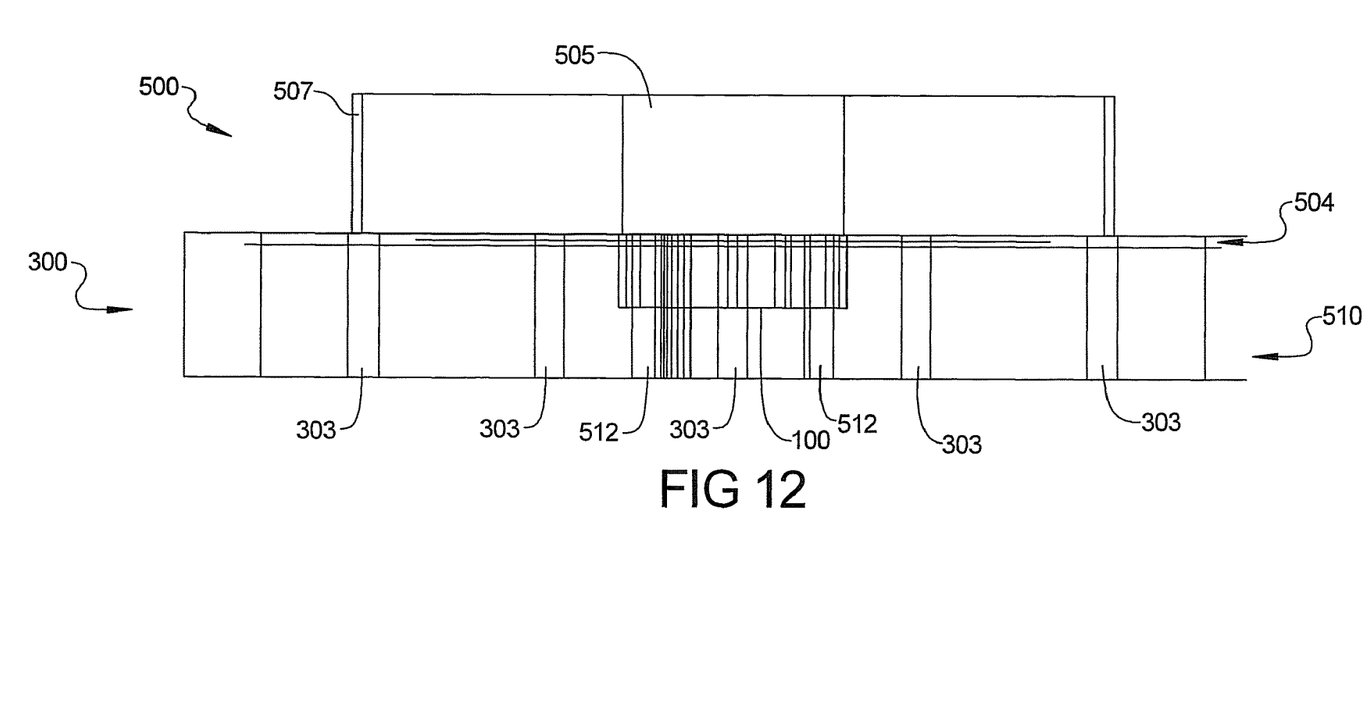
FIG. 12 is a side view of the module of FIG. 11.
Figure 13:
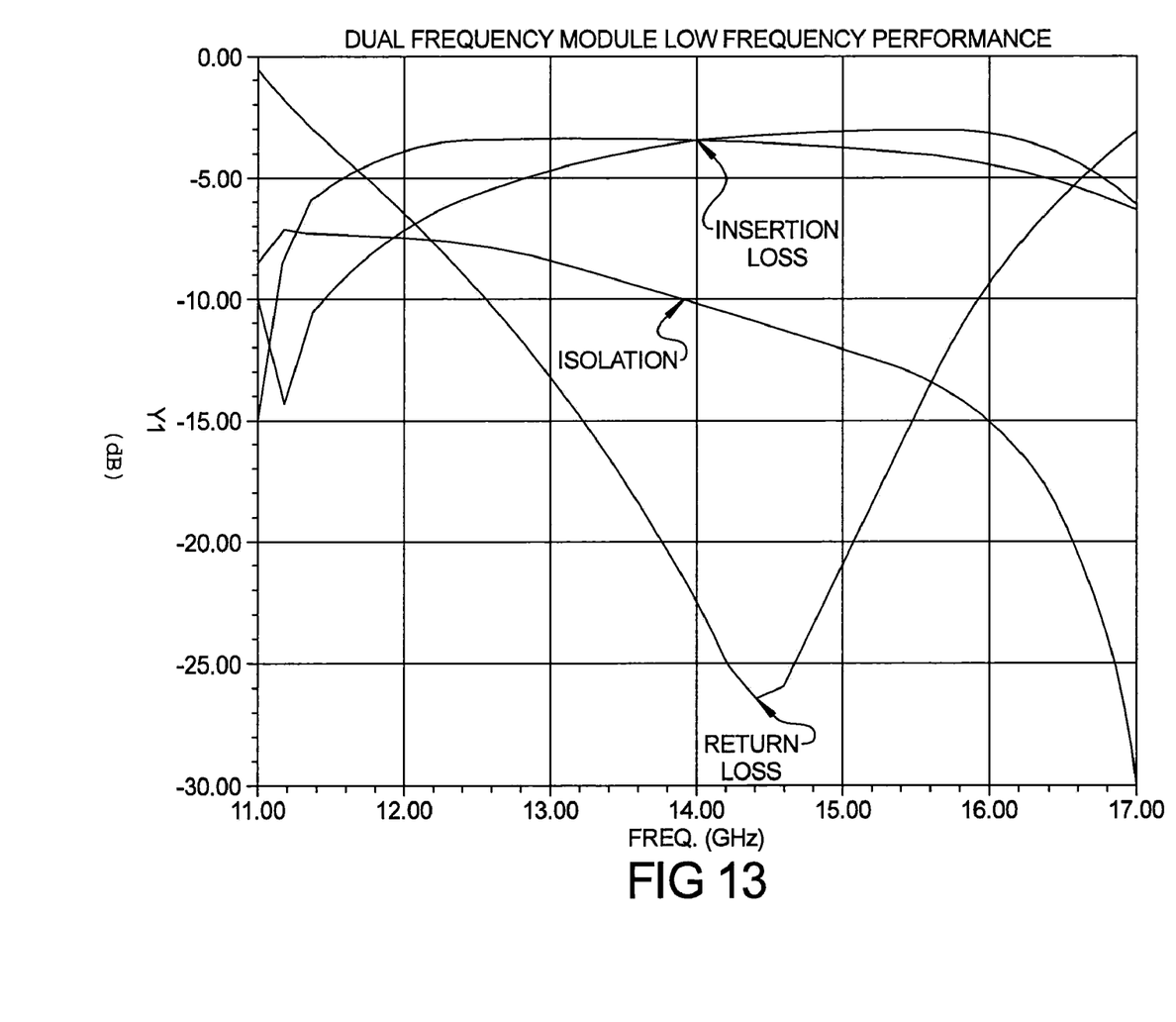
FIG. 13 is a graph showing the low frequency performance, in terms of insertion loss, isolation and return loss of the dual frequency module (in dBs relative to frequency, in GHz) of FIGS. 11 and 12.

Referring to FIGS. 10, 11 and 12, a dual band waveguide transition module 500 in accordance with another embodiment of the present disclosure is shown, which includes apparatus 100. The module 500 makes use of dual frequency impedance surface apparatus 300 with capacitive element 302a (FIG. 11), and further with the inclusion of a first pair of conductive elements 502 (FIGS. 10 and 11) formed on a surface of a dielectric 504 (FIGS. 11 and 12), and a dielectrically loaded circular waveguide 505 located above the dielectric surface 504. The waveguide 505 has an axial center disposed in alignment with the axial center of the apparatus 300. A second pair of conductive elements 506 (FIGS. 10 and 11) is formed on a surface of dielectric 510 and a dielectrically loaded circular waveguide 507 (FIGS. 11 and 12) is located above the dielectric surface 504, itself located above dielectric surface 510, with the axial center of the waveguide 507 disposed in alignment with the axial center of the apparatus 300. Certain of the electrically conductive vias 303 are also visible in FIG. 12. The waveguide 505 located on dielectric surface 504 is centered within the waveguide 507 also located on dielectric surface 504. In this example the second pair of conductive elements 506 are located 0.004" below the starting point of waveguide 507 with the resulting gap not effecting electrical performance. A conducting element 512 is formed within the apparatus 300 to connect conductive elements 506 with the underside of dielectric 510. The first pair of conductive elements 502 extend generally orthogonally to one another and are in electrical communication with a first pair of coaxial transmission lines 508 (FIGS. 10 and 11) to form a high band waveguide having a first resonant frequency. A second pair of coaxial transmission lines 513 (FIG. 11) are formed within the apparatus 300 electrically connected to the first pair of coaxial transmission lines 508 allowing the signal to be accessible on the ground side of waveguide transition module 500 at an isolated conductive pad. The apparatus 300 operates as a reflection surface for the first pair of conductive elements 502. FIG. 13 illustrates the return loss of the conductive elements 506 maximized at the resonant frequency. The insertion loss of the conductive elements 506 is minimized and balanced at the resonant frequency. The isolation of the conductive elements 506 is acceptable at the resonant frequency while maximized above the resonant frequency.

The second pair of conductive elements 506 are formed on a surface of a dielectric 510 and are similarly arranged orthogonal to one another and over a pair of conductive line sections 512 electrically connected to an isolated conductive pad on the underside of dielectric surface 510. The conductive line sections 512 are generally orthogonal to the conductive elements 506. The apparatus 300 operates as a reflection surface for the second pair of conductive elements 506. FIG. 13 illustrates the insertion loss, isolation and return loss of the dual band waveguide module 500, with the losses Y1 in dBs plotted relative to frequency in GHz.

Figure 14:
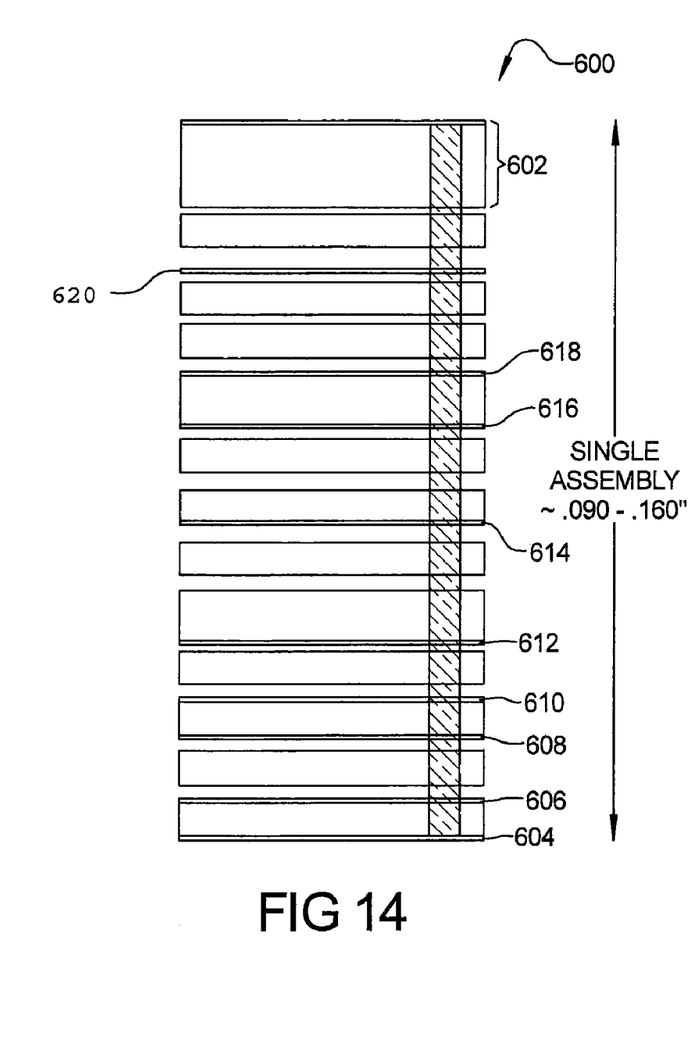
FIG. 14 is a side view illustrating exemplary layers of a printed wiring board forming an assembly stackup that makes use of the polar geometry bandgap surface of FIG. 1.

Referring to FIG. 14, the various embodiments described herein may all be constructed as a multilayer wiring board using a plurality of high frequency laminate layers of material assembled to form a unitary printed wiring board. FIG. 14 illustrates one exemplary printed wiring board 600 that includes a polar geometry bandgap portion 602, which may be identical in construction to any of the above-described embodiments of FIGS. 1-5, 7, 8, or 10-12. The printed wiring board 600 in this example includes a plurality of integrally formed layers such as a ground layer 604, a layer 606 for clock signals, data layers 608 and 610, a layer 612 on which a voltage is supplied, a "high band" layer 614 for stripline transmission of the high frequency signal, a voltage layer 616, and a "low band" layer 618 for stripline transmission of the low frequency signal, and a ground layer 620. In this example it will be noted that the entire printed wiring board 600 forms a stackup or single assembly having a height typically between 0.090 inch and 0.160 inch (2.286 mm and 4.06 m), which is significantly more compact than the 0.30 inch to 0.450 inch (7.62 mm-11.43 mm) height that is typically produced when using a quarter length back short assembly. The printed wiring board 600 also does not require the epoxying of two distinct circuit board sections together, as is required with a conventional quarter wavelength back short board.

The various embodiments thus provide high impedance bandgap surfaces and waveguide transition modules that can be manufactured significantly more easily and with less cost that traditional assemblies employing a quarter wavelength backshort. The various embodiments described herein can be used to produce an integrally formed printed wiring board assembly that is also significantly more compact that previous designs that require a quarter wavelength backshort. The various embodiments described herein are expected to find particular utility in a wide variety of phased array antenna applications for both civilian and military applications.

While various embodiments have been described, those skilled in the art will recognize modifications or variations which might be made without departing from the present disclosure. The examples illustrate the various embodiments and are not intended to limit the present disclosure. Therefore, the description and claims should be interpreted liberally with only such limitation as is necessary in view of the pertinent prior art.

What is claimed is:

1. A bandgap surface for use in a transition module, the surface comprising:
    a ground plane;
    a capacitive layer including a plurality of capacitive elements arranged within a common plane, and spaced apart from said ground plane;
    said plurality of capacitive elements including a first capacitive element having a first shape and located at an axial center of the capacitive layer;
    said plurality of capacitive elements including a plurality of second capacitive elements each having a second shape, the second shape being different than the first shape of the first capacitive element, and the plurality of second capacitive elements being arranged in polar configuration around the first capacitive element and with uniform spacing from the first capacitive element, and so as to form a plurality of concentric bands all arranged about the first capacitive element; and
    a plurality of electrically conductive vias disposed within a dielectric layer of material that conductively couple said ground plane to each of said plurality of capacitive elements.

2. The surface of claim 1, wherein
    the first capacitive element comprises a circular capacitive element; and
    the plurality of concentric bands of the plurality of second capacitive elements each comprise arcuately shaped capacitive elements.

3. The surface of claim 2, further comprising:
    an additional quantity of capacitive elements providing an additional capacitive layer, and disposed adjacent said capacitive layer.

4. The surface of claim 3, wherein said additional quantity of capacitive elements comprises:
    a group of arcuately shaped capacitive elements; and
    a circular capacitive element arranged within said group of arcuately shaped capacitive elements.

5. A dual frequency impedance surface for use in a transition module, comprising:
    a first impedance surface forming a plane, and adapted to resonate at a first frequency;
    the first impedance surface including a first capacitive element having a first shape and arranged at an axial center of the first impedance surface;
    the first impedance surface including a plurality of second capacitive elements each having a second shape different than the first shape;
    each of the plurality of second capacitive elements further being arranged in a polar configuration around the first capacitive element and the plurality of second capacitive elements all being spaced with uniform spacing from the first capacitive element, and so as to form a plurality of concentric bands all arranged about the first capacitive element; and
    the first impedance surface placed within a void in a second impedance surface so as to be disposed within said plane and circumscribed by said second impedance surface, said second impedance surface being adapted to resonate at a second frequency different than said first frequency.

6. The dual frequency impedance surface of claim 5, wherein said second impedance surface comprises a Sievenpiper impedance surface.

7. The dual frequency impedance surface of claim 6, wherein the first impedance surface comprises a polar geometry bandgap surface, and where the plurality of concentric bands of the plurality of second capacitive elements each are arcuately shaped capacitive plates.

8. The dual frequency impedance surface of claim 5, wherein each of said first and second impedance surfaces is coupled to an electrically conductive via.

9. A waveguide for transitioning between transverse electromagnetic (TEM) wave and transverse electric (TE) wave modes, comprising:
    a tubular waveguide structure for conducting a TE wave;
    a polar geometry impedance surface disposed within said tubular waveguide structure generally normal to a longitudinal axis of said tubular waveguide structure;
    the polar geometry impedance surface including a first capacitive element having a first shape and arranged at an axial center of the first impedance surface;
    the polar geometry surface further including a plurality of second capacitive elements each having a second shape different than the first shape;
    each of the plurality of second capacitive elements further being arranged in a polar configuration around the first capacitive element, and the plurality of second capacitive elements all being uniformly spaced relative to the first capacitive element, and so as to form a plurality of concentric bands all arranged about the first capacitive element;
    a pair of coaxial transmission line sections extending orthogonal to said polar geometry impedance surface, and terminating adjacent said polar geometry surface, for conducting a TEM mode wave; and
    first and second conductive elements arranged generally at a right angle to one another, and positioned to communicate with said coaxial transmission line sections, for interfacing signals passing between said coaxial transmission line segments and said polar geometry surface such that said signals transition between said TEM and TE wave modes.

10. The waveguide of claim 9, wherein said tubular waveguide structure comprises a circular waveguide.

11. The waveguide of claim 9, wherein said plurality of second capacitive elements each comprise an arcuately shaped capacitive element arranged in a common plane.

12. The waveguide of claim 11, wherein said first capacitive element comprises a circular capacitive element arranged at an axial center relative to said plurality of second capacitive elements.

13. A waveguide for transitioning between two transverse electromagnetic (TEM) wave modes and two transverse electric (TE) wave modes, comprising:
    a tubular waveguide structure for conducting a TE wave;
    a polar geometry impedance surface disposed within said tubular waveguide structure generally normal to a longitudinal axis of said tubular waveguide structure;

the polar geometry impedance surface including a first capacitive element having a first shape, the first capacitive element being arranged at an axial center of the polar geometry impedance surface;

the polar geometry impedance surface including a plurality of second capacitive elements each having a second shape different than the first shape;

each of the plurality of second capacitive elements further being arranged in a polar configuration around the first capacitive element, and the plurality of second capacitive elements being uniformly spaced from the first capacitive element, and so as to form a plurality of concentric bands all arranged about the first capacitive element; and a first pair of coaxial transmission line sections terminating adjacent said polar geometry impedance surface, for conducting a first TEM mode wave between said first pair of coaxial transmission line sections and said polar geometry impedance surface; and first and second conductive elements arranged generally at a right angle to one another, and positioned adjacent said polar geometry impedance surface and coupled to said first pair of coaxial transmission line sections, for interfacing signals passing between said first pair of coaxial transmission line sections and said polar geometry impedance surface such that said signals transition between said TEM and TE wave modes;

a second impedance surface that resonates at a second frequency, and which is disposed adjacent said polar geometry impedance surface; and a third and fourth conductive elements arranged generally at right angles to one another, and arranged adjacent the polar geometry impedance surface for interfacing signals passing between the second impedance surface and a ground plane such that the signals transition between the TEM and TE wave modes.

14. The waveguide of claim 13, wherein said second impedance surface comprises a Sievenpiper impedance surface.

15. The waveguide of claim 13, wherein said plurality of second capacitive elements comprise arcuately shaped capacitive elements.

16. The waveguide of claim 15, wherein the first capacitive element comprises a circular capacitive element around which said arcuately shaped capacitive elements are arranged.

17. A method for forming a bandgap surface as a multilayer board assembly, the method comprising:

forming a ground plane as a first layer;

forming a capacitive layer as a second layer using a plurality of capacitive elements arranged in a polar configuration within a common plane;

further forming the capacitive layer to include a plurality of capacitive elements, the plurality of capacitive elements including a first capacitive element having a first shape and arranged at an axial center of the capacitive layer;

further forming the capacitive layer such that the plurality of capacitive elements includes a plurality of second capacitive elements each having a second shape different than the first shape;

further forming each of the plurality of second capacitive elements to reside in a polar configuration around the first capacitive element, and the plurality of second capacitive elements all being uniformly spaced relative to the first capacitive element, and so as to form a plurality of concentric bands all arranged about the first capacitive element;

disposing said second layer adjacent said first layer; and forming said first layer to include a plurality of electrically conductive vias that electrically couple said ground plane to each of said plurality of capacitive elements.

18. The method of claim 17, further comprising forming said first layer with a dielectric portion on which said plurality of capacitive elements are disposed.

19. The method of claim 18, further comprising arranging said vias within said dielectric portion generally orthogonal to said plurality of capacitive elements.

* * * * *